United States Patent [19]

Thompson

[11] 4,426,440

[45] Jan. 17, 1984

[54] INTEGRATED OPTICAL GRATING DEVICE BY THERMAL SIO₂ GROWTH ON SI

[75] Inventor: David E. Thompson, Placentia, Calif.

[73] Assignee: The United States of America as represented by the Secretary of the Army, Washington, D.C.

[21] Appl. No.: 442,700

[22] Filed: Nov. 18, 1982

[51] Int. Cl.³ .................................................. G03C 5/00
[52] U.S. Cl. ......................................... 430/321; 430/1; 430/2; 430/323; 427/162; 350/96.12
[58] Field of Search ........................ 430/1, 2, 321, 323, 430/324; 427/162; 350/96.11, 96.19, 96.12

[56] References Cited

U.S. PATENT DOCUMENTS 3,873,209 3/1975 Schinke et al. ...................... 356/135
4,384,038 5/1983 Khoe et al. .......................... 430/321

OTHER PUBLICATIONS

Ho et al., J. of Electrochemical Society, vol. 126, No. 9, pp. 1516–1530, Sep. 1979.
Zelmon et al., Appl. Phys. Letters, vol. 42, No. 7, Apr. 1983, pp. 565–566.
Chen et al., IEEE Transactions on Electron Devices, vol. Ed-25, No. 2, Feb. 1978, pp. 267–270.
R. G. Hibberd, "Integrated Circuits a Basic Course for Engineers and Technicians", Texas Instrument Incorporated, 1969, pp. 33–34.

*Primary Examiner*—John E. Kittle
*Attorney, Agent, or Firm*—John H. Raubitschek; Arthur I. Spechler; Jack W. Voight

[57] ABSTRACT

Disclosed is a method of producing an integrated optical grating device having extremely low scattering losses. The method employs a highly polished and prepared silicon chip for receiving a grating pattern or any other surface relief feature on the silicon wafer surface for its predetermined use. The pattern after it is generated is etched to a predetermined period, for example, when the pattern is for a waveguide device. An SiO₂ growth layer is thermally grown to a thickness of about 4 to 8 micrometers to replicate the generated pattern in the SiO₂ growth layer. This method yields a waveguide or similar optical grating device having undulations of extremely low values as determined by SEM photographs of this device.

5 Claims, 3 Drawing Figures

INTEGRATED OPTICAL GRATING DEVICE BY THERMAL SIO₂ GROWTH ON SI

DEDICATORY CLAUSE

The invention described herein was made in the course of or under a contract or subcontract thereunder with the Government; therefore, the invention described herein may be manufactured, used and licensed by or for the government for governmental purposes without the payment to me of any royalties thereon.

BACKGROUND OF THE INVENTION

Prior art has taught the use of gratings in $SiO_2$ on Si integrated optical structures to deflect the guided optical waves, focus them, and confine waves to desired optical circuit regions. Also, prior art has taught the fabrication of these gratings by holographic exposure of photoresist layers on the integrated optic surface and sometimes subsequent etching of the waveguide or other optical layers on top of the waveguide or below the waveguide to generate the guided wave-grating interaction.

The development program of a low loss optical waveguide by using the natural oxide of a polished silicon wafer as the beginning material has evolved along two routes or two stages. The first stage of development pursued the route directed to the determination of $SiO_2$ formation rates on polished Si wafers, and the effects encountered as long, high-temperature processing is performed. The second stage of development pursued the route directed to the treatment of the $SiO_2$ layer in order to increase the upper film refractive index and to increase the wave binding to the top of the film and avoid the absorption incurred when the evanescent tail of the bound mode extends into the Si substrate.

The growth of $SiO_2$ substrate is carried out by holding the Si wafer temperature between 900°–1050° C. in steam or $O_2$ at atmospheric pressure. The oxide grown is roughly twice the thickness of the Si material used. The growth rate of the steam oxide system indicates that an oxide thickness in micrometers ($\mu$m) of 2, 3, 7, and 12 require growth times of 10, 30, 100, and 300 hours at 1 atmosphere $H_2O$. This system of growth is for (100) oriented Si with slight ($10^{14}$) boron doping. This growth rate is greatly enhanced by increasing the steam pressure. At 10 times atmospheric pressure, the oxide formation rate is about five times the one atmosphere rate. The growth rate of $SiO_2$ is dependent on all the parameters of temperature pressure, orientation, resistivity, and so forth as taught by C. P. Ho and J. D. Plummer: *Journal of Electrochemical Society*, Vol. 126, No. 9, pp. 1516–1530.

The effect of creating a thick oxide of 5–15 $\mu$m on a Si wafer introduces tremendous strains at the interface of the film when the oxidized wafer is cooled to room temperature. This effect is evaluated by reflection techniques wherein a three-inch-diameter wafer with a 14 $\mu$m oxide is employed to reflect the image of a white ruler. The strong curvature is evident. This curvature is caused by the different oxide thickness on the polished front versus the unpolished (fine ground) reverse side of the wafer. For oxide thicknesses of less than 8 $\mu$m, this deformation has not been observed.

Other deformations of the Si wafer are observed with all the oxide thicknesses, however; and they are even more difficult to eliminate and are certainly more important to the future generation of low loss waveguides on Si subtrates. The crystalline imperfections, dislocations, etc., will propagate when the temperature is high, and the stresses due to the oxide may contribute to this process. These imperfections move from the outer region of the crystal where the growth process has produced them, to the center region of the wafer. This causes the center region ($\sim 1''$ diam) of the wafer to appear nonuniform and undulated, and the inclination to spontaneous cleavage in undesirable places is a danger to the wafer. This effect is less of a problem when the substrate resistivity is low ($<1\Omega$-cm).

The as-grown thick $SiO_2$ has built-in wave binding condition such that the undoped oxide is a low-scattering, relatively low-loss ($\sim 3$ dB/cm) waveguide. This factor has not yet been explained but the cause of this inherent waveguide is suspected to be related to the thermal expansion coefficient difference between Si and $SiO_2$ and the large stresses introduced in the film. Also, the $SiO_2$ density varies with thickness and this contributes to the index profile. The mode index and mode depth versus oxide thickness has been evaluated for the steam oxide waveguides. Clearly the refractive index of the thermally grown $SiO_2$ does not vary a lot since the $TE_0$ mode index is about 0.008 greater than the value for thin ($<1$ $\mu$m) thermal oxide $SiO_2$ layers, and the mode depth is a significant fraction of the $SiO_2$ film thickness. Also, the linear relationship between mode thickness and $SiO_2$ total thickness suggests the mechanism generating the index differential is held near the Si—$SiO_2$ interface.

Most waveguides have surface scattering as the dominate loss mechanism; therefore, if the dominate cause of loss can be identified and corrective procedure applied, a low-scattering waveguide may be developed to have an ultra-low loss. The loss is observed to decrease with increasing oxide thickness where more energy propagates in the low-loss $SiO_2$ further away from the absorbing Si substrate. This conclusion is reasoned from the observed increase of mode depth with increasing oxide thickness. Thus the preceding argument indicates that the dominate mechanism for loss in the thick oxide waveguides is silicon absorption.

It is clear, therefore, that the thermal oxide waveguide is somewhat unsatisfactory, or at least not an optimum selection to the need for a low-loss waveguide. The second stage of the waveguide development process was pursued with the goal of treating the oxide surface in such a way as to increase the refractive index near the surface and bind the wave more closely to upper surface away from the Si substrate.

Techniques applied by others to form optical waveguides were considered in the plan to reduce the loss in the thick $SiO_2$ waveguides. Facilities employed such techniques as sputtering and evaporation coating equipment, high temperature diffusion furnaces and ion implantation to 500 kV. Materials employed as surface treatment components included phosphorous, boron, 7059 glass, lead oxide, copper oxide, alumina, and titanium oxide. The implanter was used to dope the $SiO_2$ with boron and phosphorous, and the other materials were used as diffusant sources in thin film layers on the thermal oxide film.

Efforts pursued by the described techniques have not achieved the desired ultra-low loss optical waveguide. Because of the imperfections of the Si substrate (crystalline imperfections, dislocations, etc., which will propagate when the temperature is high and the stresses due to different oxide thickness on the polished front versus the unpolished, fine ground, reverse side of the wafer), and because of the difficulty in handling the oxidized wafers and, in particular, this difficulty which relates to the fragile nature of the $SiO_2$ surface, an improved method is desired for producing more perfect gratings in a waveguide requiring low scattering losses. This desired method is enhanced by failure of two techniques pursued wherein the grating is required to be coupled to the waveguide mode either as spatial modulation of the waveguide upper or lower boundary, or as a film deposited upon the upper boundary. Although both techniques were pursued, with the primary effort being devoted to the corregated surface gratings, the thin film gratings of photoresist did not provide the low scattering grating required for a desired device.

Gratings established in $SiO_2$ waveguide by ion milled technique with a step height of the grating of about 1000 Å proved to be unsuitable for efficient beam reflection due to the nature of the edge of the strip. The roughness of the edge caused intense scattering of the guided wave beam out of the waveguide. Some mode coupling is expected due to the thickness step, but the roughness of several microns is far too coarse for low loss devices.

Therefore, an object of this invention is to provide a method of growing a waveguide of $SiO_2$ wherein the $SiO_2$ is produced as a replica of an original Si surface.

A further object of this invention is to produce an integrated optical grating device by a method wherein a grating pattern is first holographically produced on an original highly polished, Si surface, the Si surface pattern is milled away by reactive ion etching, chemical etching, or ion beam milling, and a $SiO_2$ formation process is completed to grow a 4–8 µm oxide layer which produces the grating replicated in $SiO_2$.

SUMMARY OF THE INVENTION

An integrated optical grating device is fabricated in a polished silicon (Si) wafer surface by holographic exposure-etching techniques. A grating or the desired surface relief feature is generated in the polished Si wafer surface, and the $SiO_2$ is grown on top of the Si wafer surface, thereby achieving a $SiO_2$ replica of the grating or surface relief feature generated in the polished Si wafer.

The prepared Si wafer, having the grating or desired surface relief feature generated thereon, is heated to about 1000° C. in $H_2O$ vapor at 1 to 10 times atmospheric pressure to thereby produce a thick $SiO_2$ layer which contains the waveguide and grating device simultaneously. The thick layer ($\approx$4–8 µm) of $SiO_2$ as Si has extremely low scattering losses. The method of this invention allows the generation of the gratings or any other surface relief features on the Si wafer surface prior to the waveguide growth. The desired surface relief features are easier to produce on the Si surface and the $SiO_2$ grown thereon to produce the replica of the relief features rather than producing the features on the $SiO_2$ surface by reactive ion etching techniques. The resulting waveguide contains the desired grating or other surface structure without having compromised the low scattering properties of the waveguide.

DESCRIPTION OF THE PREFERRED EMBODIMENT

The method of this invention produces an integrated optical grating device by thermal $SiO_2$ growth on a polished and prepared silicon wafer having a grating or surface relief pattern on the silicon wafer surface.

The method comprises providing a highly polished silicon (Si) wafer which serves as the substrate or a chip on which a waveguide is constructed, holographically producing a grating on the Si wafer surface, milling away a portion of the Si wafer surface by reactive ion etching, chemical etching, or ion beam milling, and completing a $SiO_2$ formation process to grow a 4–8 µm growth of $SiO_2$ on the Si chip surface wherein the grating is replicated in the $SiO_2$.

Figure 1:
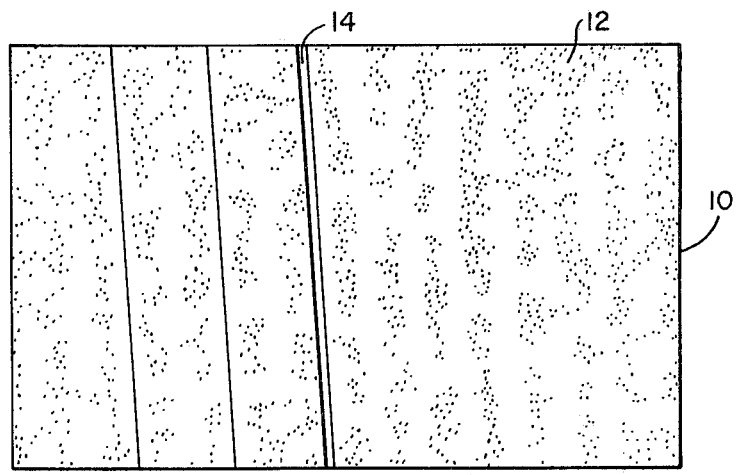
FIG. 1 of the drawing depicts a grating pattern generated in a highly polished silicon wafer surface.
Figure 2:
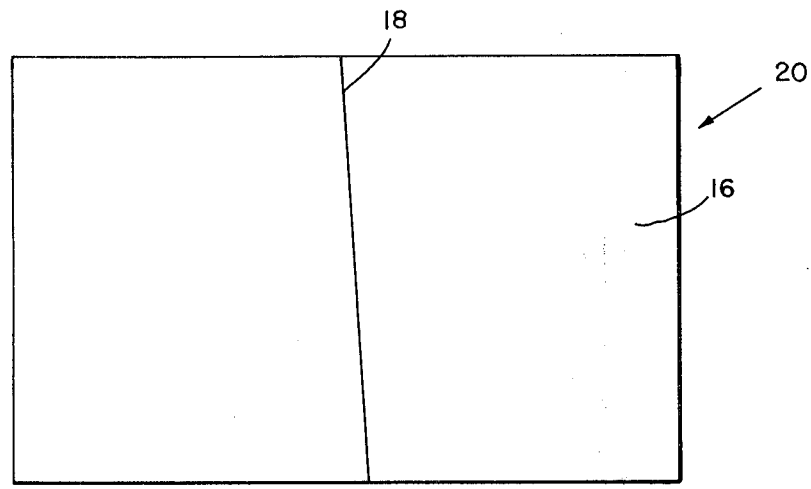
FIG. 2 depicts the grating pattern replicated in a $SiO_2$ growth layer grown on the highly polished silicon wafer surface generated in the silicon wafer surface.
Figure 3:
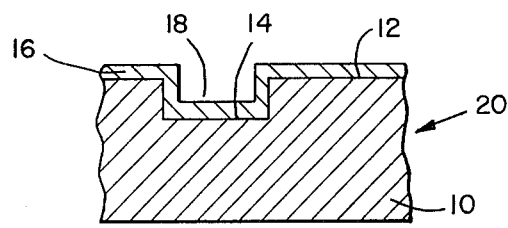
FIG. 3 depicts an enlarged sectional view, partially cut-away, of a waveguide having a grating pattern replicated in a $SiO_2$ growth layer.

In further reference to the figures of the drawing FIG. 1 depicts a silicon wafer 10 having a highly polished surface 12 with grating pattern 14, ion milled into the silicon surface. FIG. 2 depicts a silicon wafer 20 with a 5.5 micrometers steam growth layer of $SiO_2$ 16 and further showing the grating 14 of FIG. 1 as it appears in the form of the replicated grating 18 in the $SiO_2$ surface layer. FIG. 3 depicts an enlarged, sectional view of a waveguide device 20 which depicts a silicon chip 10 having a highly polished silicon surface 12 that has a grating pattern or surface relief feature 14 which is generated as a replica 18 of the grating or surface relief feature in the $SiO_2$ growth layer 16.

The $SiO_2$ formation process employed to replicate the grating pattern generated in the silicon surface is described in detail hereinbelow.

The $SiO_2$ formation process comprises heating the Si wafer, having a grating pattern prior etched in the Si wafer surface, to 1000° C. in $H_2O$ vapor of 1 to 10 times atmosphere pressure for a predetermined time period to grow a $SiO_2$ layer from about 4–8 µm thickness on the Si wafer surface to thereby produce the grating in the waveguide by growing the $SiO_2$ layer as a replica of the original Si surface.

A growth time from about 2 to about 60 hours is required where the water vapor pressure is maintained at about 10 atmospheres and a temperature of about 1000° C. to grow a $SiO_2$ layer over the range from about 2 to a 12 micrometers thickness. The growth time is increased to about 10 to about 300 hours for a 1 atmosphere pressure and like thickness grown at the higher atmosphere pressure.

The generation of the gratings or any other surface relief features on the Si wafer surface prior to the waveguide growth permits the prefabrication of all elements on the Si surface where surface relief is easier to produce than on the $SiO_2$ surface by reactive ion etch. The resulting waveguide contains the desired grating or other surface structure without having compromised the low scattering properties of the waveguide.

SEM photograph of a 2500 Å period grating as ion beam milled into a Si surface indicated about 300–500 Å undulations with a 2500 Å period; however, an SEM photograph of the same grating after a 5.5 µm growth of $SiO_2$ indicating a smoothing out of this profile. Several demonstrations of patterns produced by reactive ion etching have shown that a grating of 2500 Å period and 1 μm undulation can be achieved. This amount of milling would probably not be required, but could be available to control the top surface undulation depth. The SEM photographs distinctly show the grating structure in the surface even though the period of the grating is a factor of 22 smaller than the $SiO_2$ growth of 5.5 μm.

FIGS. 1 and 2 of the drawing illustrate the features shown very distinctly by SEM photographs as described hereinabove.

I claim:

1. A method of producing an integrated optical grating device having extremely low scattering losses from an optical grating pattern or other surface relief feature generated in a highly polished and prepared silicon wafer surface and replicated in a subsequently grown thermal layer of $SiO_2$, said method comprising:
   (i) providing a silicon wafer having a highly polished surface and prepared for receiving a grating pattern or any other surface relief feature pattern on said silicon wafer surface for its predetermined use;
   (ii) generating said grating pattern or other surface relief feature pattern on said highly polished silicon wafer surface by a holographic exposure-etching technique;
   (iii) milling away a portion of the silicon wafer surface by reactive ion etching, chemical etching, or ion milling to produce said grating or other surface relief feature in accordance with said pattern generated on said highly polished silicon wafer surface; and,
   (iv) growing a 4–8 micrometers thick growth layer of $SiO_2$ on said silicon wafer wherein said produced grating or other surface relief feature is replicated in said $SiO_2$ growth layer.

2. The method of producing an integrated optical grating device as disclosed by claim 1 wherein said growing of 4–8 micrometers thick growth layer of $SiO_2$ on said silicon wafer having said generated pattern or other surface relief feature is effected by a $SiO_2$ formation process which comprises heating said silicon wafer to about 1000° C. in water vapor of 1 to 10 times atmospheric pressure for a predetermined time period to effect the growth of a $SiO_2$ layer to said thickness.

3. The method of producing an integrated optical grating device as disclosed by claim 2 wherein said $SiO_2$ formation process employs a predetermined growth time from about 10 to about 300 hours and wherein said water vapor is at about 1 atmosphere of pressure.

4. The method of producing an integrated optical grating device as disclosed by claim 2 wherein said $SiO_2$ formation process employs a predetermined growth time from about 2 to 60 hours and wherein said water vapor is about 10 atmospheres.

5. The method of producing an integrated optical grating device as disclosed by claim 4 wherein said grating produced in said highly polished silicon wafer surface has a period of about 0.25 micrometer, and wherein said $SiO_2$ growth layer is about 5.5 micrometers thick which replicates said grating in the top surface of said $SiO_2$ growth layer, said replicated grating in said $SiO_2$ growth layer additionally characterized by having an extremely low scattering loss when functioning as a waveguide or similar functioning device.

* * * * *